United States Patent [19]

Stockton

[11] Patent Number: 4,719,598

[45] Date of Patent: Jan. 12, 1988

[54] BIT ADDRESSABLE PROGRAMMING ARRANGEMENT

[75] Inventor: David W. Stockton, Palm Bay, Fla.

[73] Assignee: Harris Corporation, Melbourne, Fla.

[21] Appl. No.: 739,843

[22] Filed: May 31, 1985

[51] Int. Cl.$^4$ .............................................. G11C 7/00
[52] U.S. Cl. .................................. 365/189; 365/230; 365/242
[58] Field of Search ............... 365/189, 230, 104, 103, 365/94, 96, 105, 242, 233

[56] References Cited

U.S. PATENT DOCUMENTS

| | | | |
|---|---|---|---|
| 3,689,712 | 9/1971 | Dennard | 365/230 |
| 3,740,723 | 6/1973 | Beausoleil et al. | 365/230 |
| 3,753,235 | 8/1973 | Daughton et al. | 365/200 |
| 3,906,461 | 9/1975 | Cappon | 365/184 |
| 4,276,617 | 6/1981 | Le | 365/189 |
| 4,374,430 | 2/1983 | Higuchi | 365/104 |
| 4,628,480 | 12/1986 | Floyd | 365/233 |

FOREIGN PATENT DOCUMENTS

| | | | |
|---|---|---|---|
| 0002029 | 9/1979 | Japan | 365/230 |
| 0125292 | 7/1983 | Japan | 365/189 |

Primary Examiner—Terrell W. Fears
Assistant Examiner—Glenn A. Gossage
Attorney, Agent, or Firm—Barnes & Thornburg

[57] ABSTRACT

A programming arrangement for programmable matrices which have a plurality of memory elements, input terminals for addressing the elements, input/output terminals for receiving a signal from an addressed element when the matrix is operated in a READ mode, and for receiving programming signals when the matrix is operated in a PROGRAM mode, and a programming current supply source. The arrangement provides for controlling the flow of programming current to any of the memory elements by application of programming signals to less than all of the input/output terminals. A programming decoder is provided having inputs connected to the input/output terminals and outputs connected to apparatus for controlling the flow of programming current. The decoder expands the programming utility of the input/output terminals and, thus, allows for programming of redundant rows of columns, programmable output polarity apparatus, and other special matrix features via the available device pins. The need for additional device pins and/or increased use of supervoltage or "zenered" pin techniques is avoided.

17 Claims, 2 Drawing Figures

BIT ADDRESSABLE PROGRAMMING ARRANGEMENT

BACKGROUND AND SUMMARY OF THE INVENTION

The present invention relates generally to programming arrangements for matrices and, more particularly, to programming arrangements which involve application of programming and/or programming control signals to output terminals as a part of the programming operation.

Programmable memory devices, such as RAMS, PROMS, EPROMS, EEPROMS, etc., are typically programmed by techniques which include addressing of a desired memory location and application of a programming signal, or a programming control signal, to an output terminal which corresponds to the addressed location. This latter step is often accompanied by the application of one or more PROGRAM mode enable signals to selected device terminals. Due to the relative shortage of available pins on most memory devices, the enable signals and/or the signals applied to the output terminals are often relatively high level (i.e., supervoltage) signals, allowing individual pins to be used for more than one function.

U.S. Pat. No. 4,125,880 to Taylor is a Harris Corporation Patent which illustrates a programming technique of this type. In Taylor, a ten volt signal is applied to output pin 60, causing a zener diode 74 to conduct and transistor 72 to turn on. The power supply terminal $V_{CC}$, which is connected to the collectors of the transistors in the matrix, is raised from the normal operating level of 5 volts to a programming level of 12 volts. When a selected memory location is addressed, diode 78 and transistor 72 provide a low impedance current sink for the flow of programming current resulting from the high collector voltage present at the selected memory location. A voltage is applied to chip enable terminal 20 to turn off transistor 52 to prevent programming currents or voltages from damaging output transistor 58.

Although the use of "zenered" or supervoltage inputs does expand the range of programming and testing functions which can be implemented on a given device, this technique does not entirely alleviate the pin shortage problem. Furthermore, increased use of higher than normal logic level voltages for programming or control functions can result in increased power consumption and can require additional circuitry to provide protection for voltage sensitive components. Accordingly, there exists a need for a programming arrangement which allows for expanded use of the available device pins, and for simplified programming of additional features and special matrix functions associated with particular devices, without requiring an increase in the use of supervoltage programming techniques.

The present invention relates to a programming arrangement for programmable matrices of the above-noted types which provides a means for controlling the flow of programming current to any of the individual memory locations in the matrix by application of programming signals to less than all of the device output terminals. The remaining output terminals are thus available for use in programming and/or selection of a variety of special matrix functions which may be advantageously incorporated into particular devices.

As used in this application, the term "special matrix function" is intended to include all selectable or controllable features associated with a device, over and above the "normal" addressing and programming of the individual memory locations. For example, a special matrix function can include the provision of a programmable output polarity feature. Such a feature could be activated to invert selected outputs when a coded command is given via the "extra" output terminals available on a device constructed according to the present invention. Another example (discussed in more detail below) involves the programming of redundant rows and/or columns in a matrix. Yet another example is use of one or more of the available outputs to control a selectively synchronous or asynchronous chip enable function. In this example, the outputs of a device can be selectively tri-stated (i.e., allowed to float) in response to a clock pulse (the synchronous mode) or upon command (the asynchronous mode) by programming signals applied to output terminals made available by the programming arrangement of the present invention.

Accordingly, an object of this invention is to provide a programming arrangement for a matrix which allows for programming of desired memory locations and an increased number of special matrix functions using presently available input and output terminals.

Another object of the present invention is to provide a programmable matrix with expanded programming capabilities which does not require the use of additional supervoltage input terminals.

These objects are attained in a programmable matrix which comprises a plurality of memory elements arranged in an array of X by Y intersecting lines, inputs for addressing at least a portion of the Y lines, and input/output apparatus for receiving a sensing signal from an addressed memory element when the matrix is operating in a sense mode and for addressing the X lines of the matrix when the matrix is operating in a programming mode. The input/output apparatus includes N input/output terminals and programming apparatus for controlling a flow of programming current to any of the memory elements by application of programming signals to less than all of the N terminals. The programming apparatus includes a programming decoder having a first set of outputs for controlling the flow of programming current to the matrix in response to programming signals present at the decoder inputs which are connected to a subset of the N terminals. The decoder also includes a second set of outputs for addressing special matrix functions (such as redundant columns or rows, programmable output polarity states, etc.) in response to programming signals applied to at least one of the N terminals. In a preferred embodiment, the number of input/output terminals N is equal to 8. In this embodiment, the X lines of the matrix are addressed by application of programming signals to three of the eight input/output terminals. A fourth terminal is used to accept a strobe signal to initiate a programming operation. The remaining four terminals are used as inputs for addressing other functions. If used independently of the three outputs used for programming the matrix, 16 additional functions may be addressed. If combined with the three terminals used for matrix programming, a total of 120 additional functions can be addressed. In alternative embodiments, N may be equal to four or sixteen.

Using this technique, a memory element to be programmed is addressed by the Y line inputs and by a subset of the N input/output terminals. A programming strobe signal is applied to one of the remaining input- /output terminals and a flow of programming current is triggered. To program a special function, the "address" applied to the input/output terminals is changed and the strobe initiated to effect the desired programming. This technique results in expanded programmability of the matrix, while eliminating the need for additional supervoltage pins.

Other objects, advantages and novel features of the present invention will become apparent from the following detailed description of the invention when considered in conjunction with the accompanying drawings.

DETAILED DESCRIPTION OF THE DRAWINGS

Figure 1:
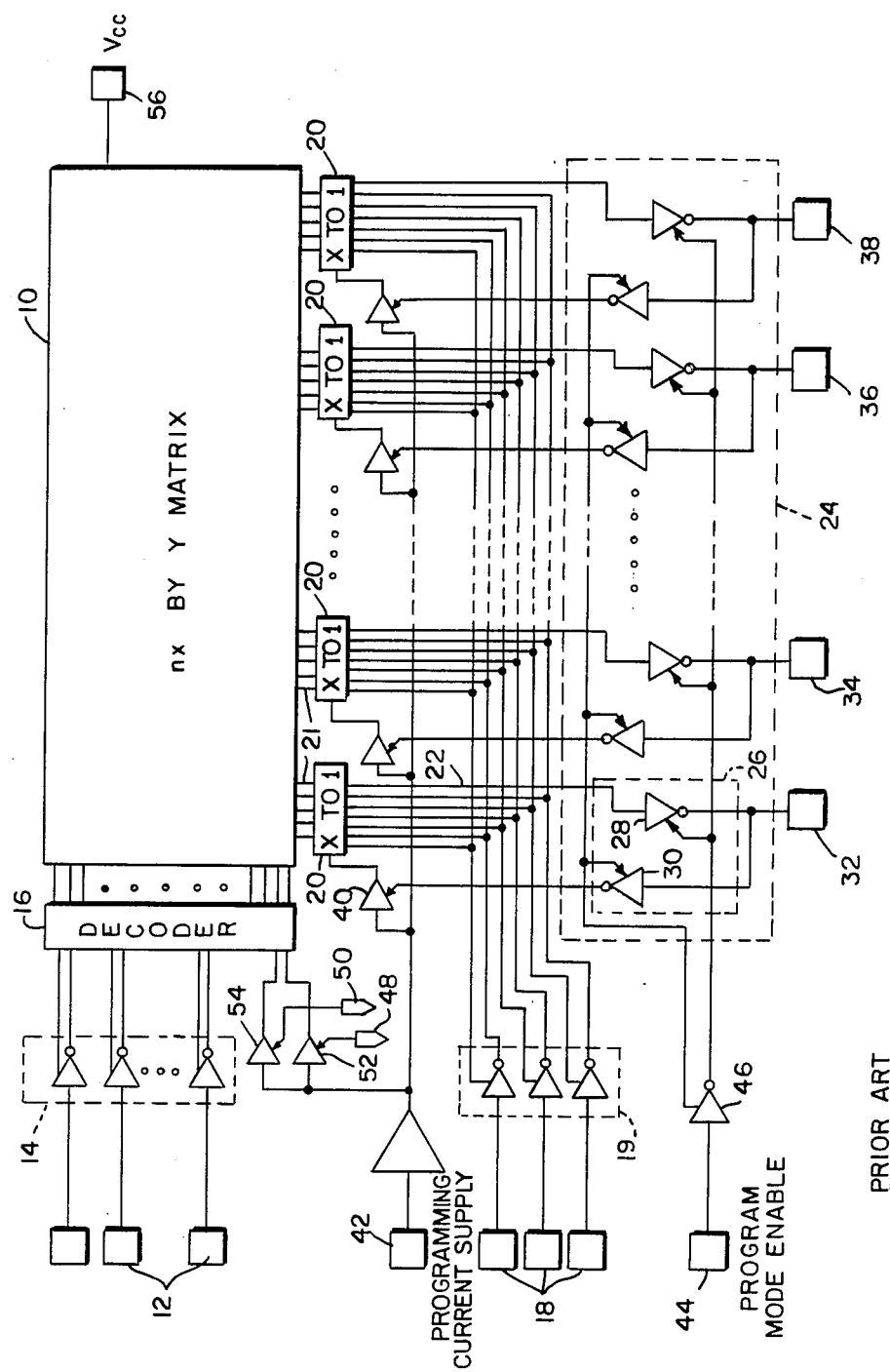
FIG. 1 shows a programmable matrix architecture for use with prior art programming techniques.

FIG. 1 shows a programmable matrix architecture for use with prior art programming techniques. The arrangement in FIG. 1 includes a programmable matrix 10 having Y rows and N X columns. The Y rows are addressed by means of input circuitry which includes row input terminals 12, row input buffer 14, and decoder 16. The columns of matrix 10 are addressed by circuitry which includes column input terminals 18 and column input buffer 19 connected in parallel to N (X to 1) decoders 20. Each decoder is connected to bit lines 21 of the matrix. Each decoder output 22 is connected to a bidirectional buffer 24. A representative segment of bidirectional buffer 24, as indicated by a broken line and reference numeral 26, includes output inverter 28 and input inverter 30. The input of inverter 28 is connected to decoder output 22 and the output of inverter 28 is connected to terminal 32 which is one of N input/output terminals. The input of inverter 30 is also connected to terminal 32 and the output of inverter 30 is connected to a switchable buffer 40 for controlling the flow of programming current from the programming supply terminal 42. Inverters 28 and 30 are switchable inverting buffers whose operation is controlled by a programming mode enable signal applied at input terminal 44. Input terminal 44 is connected to inverters 28 and 30 by a dual output (i.e., inverting and non-inverting) buffer 46.

Matrix 10 of FIG. 1 includes two redundant rows which may be used to replace defective rows in the matrix. Replacement is effected by programming decoder 16 by applying a supervoltage to pins 48 and 50, which respectively control the operation of switchable buffers 52 and 54. The circuit of FIG. 1 also includes a power supply terminal 56 for application to the matrix of an operating voltage $V_{CC}$.

When the matrix is operating in the READ or SENSE mode, a memory element is addressed by applying address signals to terminals 12 and 18. In response to these signals, an output signal appears at outputs 22 of decoders 20, and is applied to the inputs of output inverters 28. The signal is subsequently inverted and available at the N output terminals, generally represented by terminals 32, 34, 36 and 38 in FIG. 1.

Figure 2:
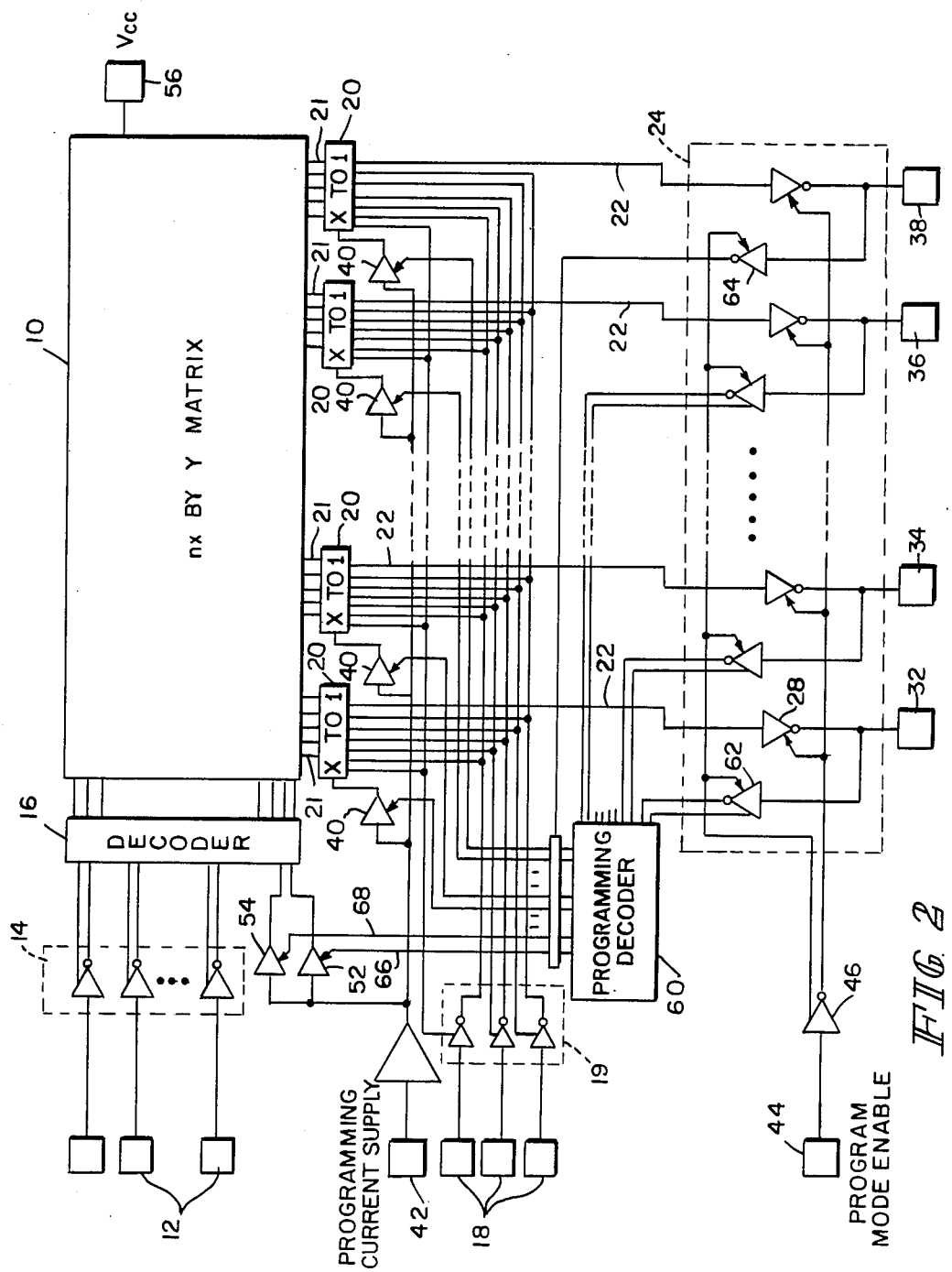
FIG. 2 shows a programmable matrix architecture having programming apparatus according to the present invention.

When the matrix is operating in the PROGRAM mode, a programming enable signal is applied to input terminal 44. This signal is applied, via buffer 46, to output inverters 28 and 30, serving to convert the N input/output terminals to input terminals for programming purposes. When a memory location in the matrix is addressed by inputs 12 and 18 for programming, application of a signal at the respective output terminal switches buffer 40 and allows programming current to flow to the selected memory element. Application of a supervoltage on pins 48 and/or 50 activates switchable buffer 52 and/or 54 to allow programming of decoder 16 resulting in replacement of a defective matrix row by a redundant row. When this replacement takes place, the switchable buffers and associated activating circuitry have no further use. FIG. 2 shows a programmable matrix architecture which incorporates additional elements to allow for programming in accordance with the present invention. Where possible and appropriate, like reference numerals are used to indicate like elements in FIGS. 1 and 2. The new or modified element present in FIG. 2 is programming decoder 60. Bidirectional buffer 24 has been modified by the addition of dual output inverter 62, which replaces output inverter 30 from FIG. 1. In addition, supervoltage pins 48 and 50 are not required in the circuit of FIG. 2.

Operation of the circuit of FIG. 2 in the READ or SENSE mode does not differ from operation of the circuit shown in FIG. 1. However, operation in the PROGRAM mode does differ. For purposes of illustration only, it will be assumed that the circuit of FIG. 1 has eight output terminals (i.e., N is equal to 8). For programming, addressing signals are applied to terminals 12 and 18. This causes eight separate memory locations within matrix 10 to be selected for programming. In the prior art circuit of FIG. 1, one of the eight addressed memory locations is selected for programming by application of a programming signal to the corresponding output terminal to cause the associated switchable buffer 40 to conduct the flow of programming current. Thus, all eight output terminals are required to make the final selection of the memory element to be programmed.

In the circuit of FIG. 2, output buffer 62 (which is a switchable buffer having both inverting and non-inverting outputs) replaces switchable inverter 30, and the outputs of device 62 are connected to the inputs of programming decoder 60. A first set of output of programming decoder 60 control switchable buffer 40 for each of the eight decoders. The final selection of the memory location to be programmed can thus be accomplished, in this example, by using three of the N output terminals. One of the remaining output terminals (terminal 38 in FIG. 2) is connected to a single output switchable buffer 64 and serves as a strobe input for initiation of the programming operation. The remaining four outputs are similarly connected to the inputs of programming decoder 60 and control corresponding outputs of programming decoder 60 which may be used to control special matrix functions. In FIG. 2, outputs 66 and 68 are connected, respectively, to the control terminal of switchable buffers 52 and 54 to control programming of the redundant rows. These outputs thus replace supervoltage pins 48 and 50 in the circuit shown in FIG. 1.

From the preceding description of the preferred embodiment, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A programmable matrix, comprising:
   a plurality of memory elements arranged in an array of X by Y intersecting lines;
   input means for addressing at least a portion of said X and Y lines;
   input/output means for receiving a sensing signal from an addressed memory element when the matrix is operated in a READ mode, and for receiving programming signals when the matrix is operated in a PROGRAM mode, said input/output means including N bi-functional input/output terminals; and
   programming means, including a programming decoder, connected to the matrix and to the N bi-functional input/output terminals, for controlling a flow of programming current to any of said memory elements in response to application of programming signals to less than all of said N bi-functional input/output terminals, and wherein said programming decoder has inputs for receiving said programming signals from said N terminals and has outputs connected to means for controlling said flow of programming current in the matrix in response to said application of programming signals to less than all of said N terminals.

2. A programmable matrix according to claim 1, wherein said decoder has outputs for addressing special matrix functions in response to application of programming signals to at least one of said N terminals.

3. A programmable matrix according to claim 1, wherein a strobe signal is applied to one of said N terminals to initiate a programming operation.

4. A programmable matrix according to claim 1, wherein N is equal to four and wherein said flow of programming current is controlled by application of programming signals to two of said four terminals.

5. A programmable matrix according to claim 1, wherein N is equal to sixteen and wherein said flow of programming current is controlled by application of programming signals to four of said sixteen terminals.

6. A programmable matrix according to claim 1, wherein N is equal to eight and wherein said flow of programming current is controlled by application of programming signals to three of said eight terminals.

7. A programmable matrix according to claim 6, wherein a strobe signal is applied to a fourth one of said eight terminals to initiate a programming operation.

8. In a programmable matrix having a plurality of memory elements, input means for addressing said elements, output means, including N bi-functional input/output terminals, for receiving a signal from an addressed memory element when the matrix is operated in a READ mode and for receiving programming signals when the matrix is operated in a PROGRAM mode, and programming means for supplying a flow of programming current to the matrix when the matrix is operated in the PROGRAM mode, the improvement comprising means, including a programming decoder, for controlling the flow of programming current to any of said memory elements by application of programming signals to less than all of said N bi-functional input/output terminals, and wherein said programming decoder has a plurality of outputs connected to switchable means for selectively controlling the flow of programming current in response to said application of programming signals to less than all of said N input/output terminals, said programming decoder having a plurality of inputs for receiving said programming signals from said N input/output terminals.

9. A programmable matrix according to claim 8, wherein at least one of said programming decoder outputs is connected to switchable means for controlling programming of a special matrix function.

10. A programmable matrix according to claim 8, wherein N is equal to eight and wherein said flow of programming current is controlled by application of programming signals to three of said eight terminals.

11. A programmable matrix according to claim 8, wherein N is equal to four and wherein said flow of programming current is controlled by application of programming signals to two of said four terminals.

12. A programmable matrix according to claim 8, wherein N is equal to sixteen and wherein said flow of programming current is controlled by application of programming signals to four of said sixteen terminals.

13. A programmable matrix according to claim 8, wherein said programming decoder has a strobe input for receiving a programming current flow initiating strobe signal.

14. A programmable matrix according to claim 13, wherein said strobe input is connected to one of said N input/output terminals by said bidirectional buffer.

15. A programmable matrix according to claim 8, wherein said addressing inputs are connected to said N input/output terminals by a bidirectional buffer.

16. A programmable matrix according to claim 15, wherein said bidirectional buffer includes a switchable buffer having an input connected to one of said N input/output terminals, at least one output connected to an input of said programming decoder, and a control input connected to a PROGRAM mode enable signal source.

17. A programmable matrix according to claim 16, wherein said switchable buffer has inverting and noninverting outputs connected to respective inputs of said programming decoder.

* * * * *